United States Patent [19]

Yamashita et al.

[11] Patent Number: 5,521,557
[45] Date of Patent: May 28, 1996

[54] DELAY DETECTION CIRCUIT AND LOW-NOISE OSCILLATION CIRCUIT USING THE SAME

[75] Inventors: Kazuo Yamashita; Nobuyuki Adachi, both of Mitaka, Japan

[73] Assignee: Japan Radio Co. Ltd., Tokyo, Japan

[21] Appl. No.: 465,107

[22] Filed: Jun. 5, 1995

[30] Foreign Application Priority Data

Jan. 19, 1995 [JP] Japan ..................................... 7-006265

[51] Int. Cl.$^6$ .............................. H03L 7/00; H03L 7/085; H03L 7/087
[52] U.S. Cl. .................................. 331/11; 331/17; 327/39
[58] Field of Search ..................... 331/10, 11, 12, 331/17, 25; 327/39; 329/327, 336, 337; 455/214

[56] References Cited

U.S. PATENT DOCUMENTS 4,092,606   5/1978   Ryan ..................................... 331/12 X

FOREIGN PATENT DOCUMENTS 3-140030   6/1991   Japan .

OTHER PUBLICATIONS

"Improvements of Frequency Stability in Oscillator", Y. Sakuta et al., *Electronic Information Communication Society*, Spring National Meeting, vol. 1, pp. A–56, 1989.

Primary Examiner—David Mis
Attorney, Agent, or Firm—Oliff & Berridge

[57] ABSTRACT

A delay detection circuit and a low-noise oscillation circuit using such a delay detection circuit. When the oscillation output of a VCO is to be supplied to two high frequency mixers, a $\pi/2$ phase shifter 24 in the front stage of one of the high frequency mixers gives a quadrature form. High frequency components are removed from the output voltage of the high frequency mixers by LPF. DC components are also removed from the output voltage of the high frequency mixers by HPF. The output voltages of low frequency mixers contain secondary phase noise components proportional to squared phase noise components and primary phase noise components proportional to the phase noise components and also depending on the delay time $\tau$ of a delay unit. When the output voltage of one of the low frequency mixers is subtracted from the output voltage of the other low frequency mixer, the secondary phase noise components are offset and the dependence on the delay time $\tau$ is removed from the primary phase noise components. The resulting voltage is used as a control voltage for the VCO (10). No voltage control delay unit or feedback loop for controlling it are required.

12 Claims, 5 Drawing Sheets

DELAY DETECTION CIRCUIT AND LOW-NOISE OSCILLATION CIRCUIT USING THE SAME

BACKGROUND OF THE INVENTION a) Field of Industrial Application

The present invention relates to a delay detection circuit and a low-noise oscillation circuit using such a delay detection circuit.

b) Description of the Prior Art

FIG. 4 shows a low-noise oscillation circuit constructed in accordance with the prior art. Such a low-noise oscillation circuit is also disclosed, for example, in SAKUTA et. al., "Improvement of Frequency Stability in Oscillator", Electronic Information Communication Society, Spring National Meeting, Vol. 1, page A-56, March, 1989.

In such a low-noise oscillation circuit, the oscillation output of a voltage controlled oscillator (VCO) 10 is supplied to a high frequency mixer 14, on one hand, directly, and on the other hand, through a delay unit 12. The high frequency mixer 14 multiplies the oscillation output of the VCO 10 by the output of the delay unit 12, the result being then supplied to a low-pass filter (LPF) 16. The LPF 16 removes high-frequency components associated with the multiplication from the output of the high frequency mixer 14. The LPF 16 then feeds the filtered voltage to the VCO 10 as a control voltage. The VCO 10 oscillates at a frequency corresponding to the control voltage.

If the oscillation output voltage of the VCO 10 is represented by $$V(t) = A \cdot \cos(\omega t + \phi(t)),$$

the output voltage VP(t) of the LPF 16 may be represented by $$VP(t) = \tfrac{1}{2} A^2 \cdot \cos\omega\tau - \tfrac{1}{2} A^2 \cdot \sin\omega\tau \cdot (\phi(t) - \phi(t-\tau))$$

where A, $\omega$ and $\phi(t)$ are respectively the amplitude, angular frequency and variation of phase in the oscillation output voltage of the VCO 10 and $\tau$ is the delay time of the delay unit 12. As described in the above literature, the prior art reduces noise by setting the delay time T of the delay unit 12 to $(2m-1)\pi/2$ (where m is an integer number) while at the same time using the output voltage VP(t) of the LPF 16 to control the oscillation frequency of the VCO 10.

However, the prior art has a disadvantage in that if the delay time $\tau$ of the delay unit 12 varies due to changes of ambient temperature or with age, the noise cannot be sufficiently reduced. In such an application where the oscillation frequency (angular frequency $\omega$) of the VCO 10 is suitably changed, as in synthesizers, the delay time $\tau$ of the delay unit 12 may become offset from the optimum operating point, $(2m-1)\pi/2$, in association with the change of the oscillation frequency.

A technique of overcoming such a problem is disclosed, for example, in Japanese Patent Laid-Open No. Hei 3-140030. FIG. 5 shows a low-noise oscillation circuit as disclosed therein.

In such a low-noise oscillation circuit, the oscillation output voltage V(t) of the VCO 10 is applied to the high frequency mixer 14, on one hand directly, and on the other hand, through a voltage controlled delay unit 18. The output voltage of the high frequency mixer 14 is supplied to the VCO 10 as a control voltage. In this figure, high frequency components are ignored. In other words, the output of the high frequency mixer 14 is represented by VP(t). The voltage controlled delay unit 18 is one in which the delay time $\tau$ is controlled by voltage. The control voltage for the voltage controlled delay unit 18 is obtained by filtering the output VP(t) of the high frequency mixer 14 through the LPF 20. The cut-off frequency of the LPF 20 is set so as to remove the phase noise components, that is, the second right term of the aforementioned formula VP(t), from the oscillation output VP(t) of the high frequency mixer 14 so that only the DC components (first right term) can pass through the LPF 20. Since the DC voltage contained in the output voltage VP(t) of the high frequency mixer 14 depends on the delay time $\tau$ of the voltage controlled delay unit 18, the delay time $\tau$ of the voltage controlled delay unit can always be maintained at the optimum operating point, $(2m-1)\pi/2$ if the sensitivity of the feedback loop containing the LPF 20 is sufficiently high.

The second prior art of FIG. 5 is superior to the first prior art of FIG. 4 in that the delay time $\tau$ can be always maintained at the optimum operating point $(2m-1)\pi/2$. However, the second prior art requires a feedback loop for feeding the output of the high frequency mixer 14 back to the voltage controlled delay unit 18. Further, since sufficient sensitivity cannot normally be provided by only the LPF 20, the feedback loop requires a DC amplifier. Additionaly, although a voltage controlled electronic device such as varactor or the like can be used to provide a suitable voltage controlled delay unit, such a device is not suitable for use in providing integrated circuits. This becomes an obstacle to integrating and miniaturizing the system.

SUMMARY OF THE INVENTION

It is therefore an object of the present invention to provide a low-noise oscillation circuit which does not require the control of delay time and a feedback loop therefor and which can therefore easily accomplish the integration and miniaturization of the system.

According to the first aspect of the present invention, there is provided a delayed detection circuit for performing the detection, using delay processing, of the oscillation output of a VCO, comprising:

a) a first high frequency mixer for multiplying the oscillation output by a delayed oscillation output obtained by delaying the oscillation output by a predetermined delay time to generate a first high frequency signal;

b) a second high frequency mixer for multiplying the delayed oscillation output by a phase-shifted oscillation output obtained by phase-shifting the oscillation output or delayed oscillation output by $\pi/2$ radian to generate a second high frequency signal;

c) a first low frequency mixer for multiplying the DC and phase-noise components contained in the first high frequency signal by the phase-noise components contained in the second high frequency signal to generate a first low frequency signal;

d) a second low frequency mixer for multiplying the DC and phase-noise components contained in the second high frequency signal by the phase-noise components contained in the first high frequency signal to generate a second low frequency signal; and e) adder-subtracter means responsive to the second low frequency signal for removing dependence on the delay predetermined time from primary phase-noise components contained in the first low frequency signal to generate the control voltage without dependence.

According to the second aspect of the present invention, there is provided a low-noise oscillation circuit comprising the VCO and the delay detection circuit defined in the first aspect.

According to the third aspect of the present invention, there is provided a low-noise oscillation circuit comprising:

a) a VCO;

b) a frequency locked loop including the low-noise oscillation circuit defined in the first aspect and operative to lock the oscillation frequency of the VCO at a target value; and c) a phase locked loop for locking the oscillation phase of the VCO at a target value.

The present invention uses the first and second high frequency mixers. Either of the first or second high frequency mixer functions to multiply two different input signals by each other, the result being then outputted therefrom. The first and second high frequency mixers receive, as the input signals, the oscillation output of the VCO as well as the signal provided by delaying the oscillation output by a predetermined (constant) delay time, provided that, one of the signals supplied to the second high frequency mixer is π/2 radian phase-shifted prior to the supply thereof. Such a phase-shift i.e. quadrature conversion, provides an orthogonality between the output of the first high frequency mixer (first high frequency signal) and the output of the second high frequency mixer (second high frequency signal).

The first low frequency mixer multiplies the DC and phase noise components contained in the first high frequency signal by the phase noise components contained in the second high frequency signal. The second low frequency mixer multiplies the DC and phase noise components contained in the second high frequency signal by the phase noise components contained in the first high frequency signal. Therefore, the outputs of the first and second low frequency mixers (first and second low frequency signals) will contain the components obtained by multiplying the DC and phase noise components by each other (primary phase noise components) and the other components obtained by multiplying the phase noise components by each other (secondary phase noise components). Since the first and second high frequency signals are orthogonal to each other as described, the primary phase noise components contained in the first low frequency signal are also orthogonal to the primary phase noise components contained in the second low frequency signal.

Since the primary phase noise components contained in the first and second low frequency signals are orthogonal to each other, such a relationship can be utilized to remove a dependence on the delay time in the primary phase noise components. This means that the primary phase noise components can be provided without dependence on the delay time in the delay unit and further that the primary phase noise components without delay-time-dependency can be used as a control voltage for the VCO to eliminate the need of a voltage controlled delay unit and a feedback loop therefor. As a result, according to the present invention, on one hand, it is not required to feed back the output of the high frequency mixer for controlling the delay time and therefore the LPF and DC amplifier for forming the feedback loop are eliminated, and on the other hand, such a device as a varactor or the like, used to form the voltage controlled delay unit, is not required. This implies that the present invention can accomplish a low-noise oscillation circuit which is improved, in terms of integration and miniaturization over the prior art.

Since both the first and second low frequency signals contain the secondary phase noise components, the second low frequency signal can be used to remove the secondary phase noise components from the first low frequency signal. Thus, there is no influence due to the secondary phase noise components.

Means for extracting the DC and phase noise components from the first and second high frequency components may take the form of a low-pass filter which can remove any harmonic component. A high-pass filter may further be used to remove DC components from the output of the low-pass filter.

DETAILED DESCRIPTION OF THE PREFERRED EMBODIMENTS

Figure 4:
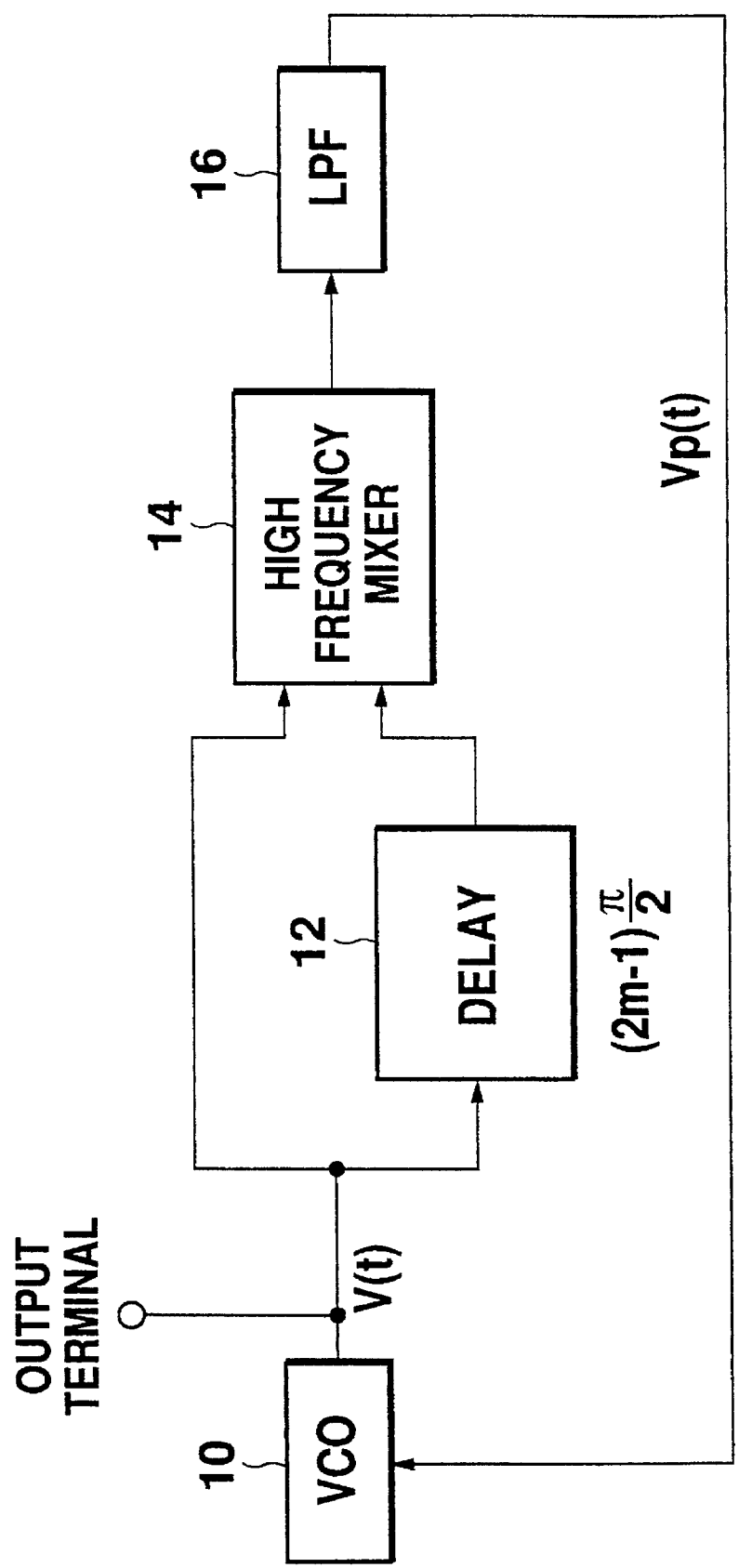
FIG. 4 is a block diagram of a low-noise oscillation circuit constructed in accordance with the prior art.
Figure 5:
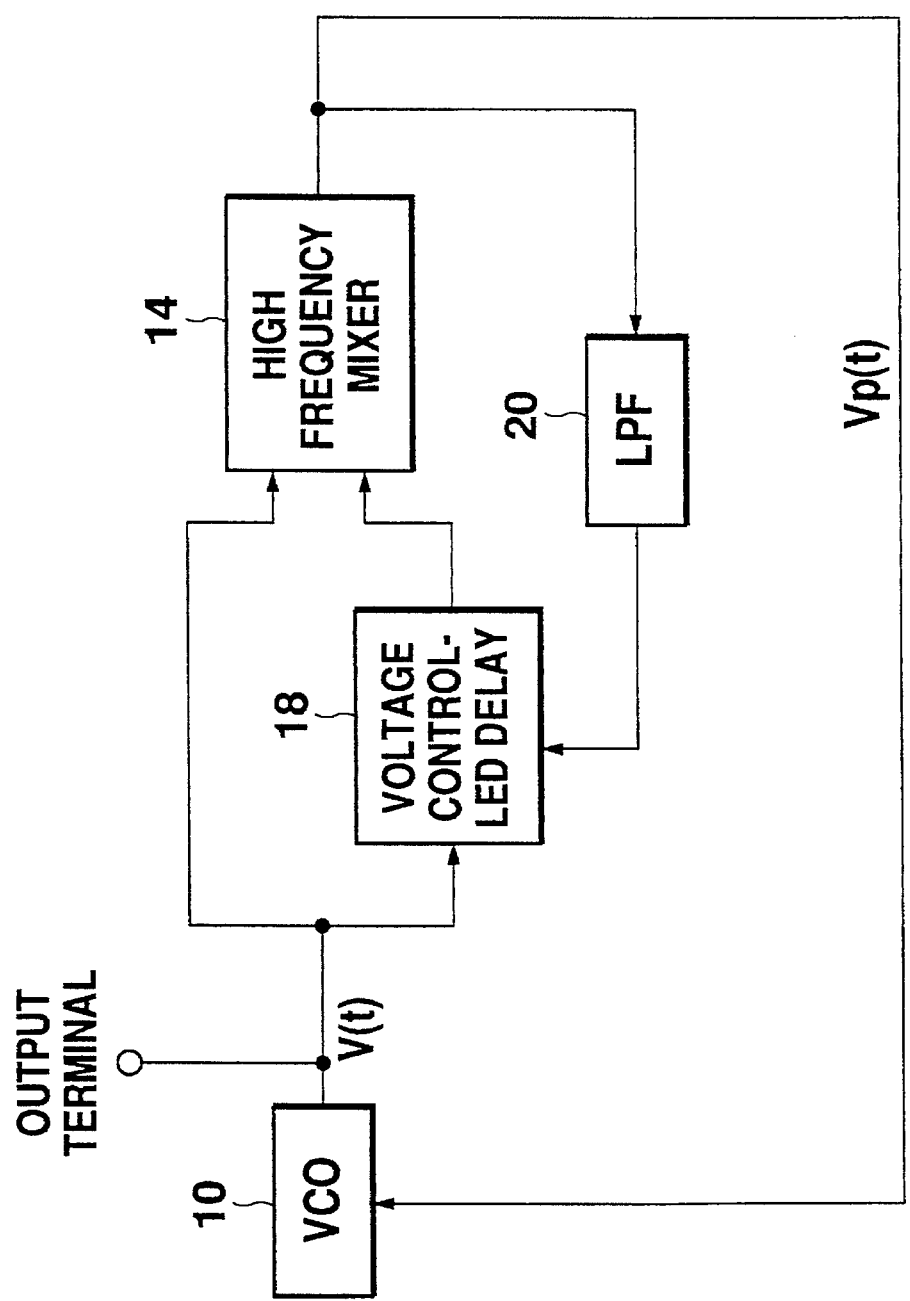
FIG. 5 is a block diagram of another low-noise oscillation circuit constructed in accordance with the prior art.

Some preferred embodiments of the present invention will now be described with reference to the drawings in which parts similar to those of FIGS. 4 and 5 are designated by similar reference numerals and will not further be described.

Figure 1:
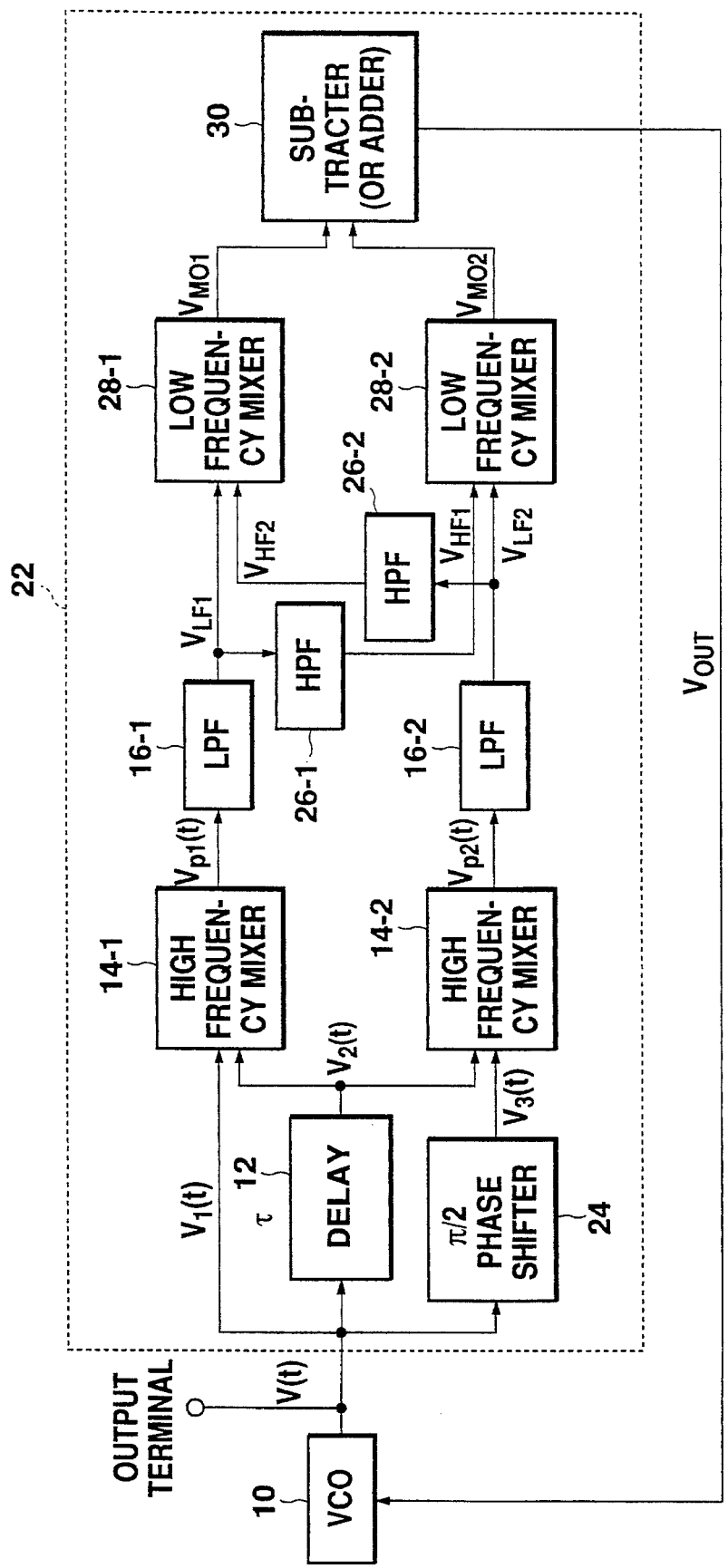
FIG. 1 is a block diagram of a first embodiment of a low-noise oscillation circuit constructed in accordance with the present invention.

FIG. 1 shows the first embodiment of a low-noise oscillation circuit constructed in accordance with the present invention. In the first embodiment, the oscillation output voltage V(t) of a VCO 10 is supplied to a delay detection circuit 22 while the output voltage Vout of the delay detection circuit 22 is supplied back to the VCO 10 as a control voltage.

The delay detection circuit 22 comprises two high frequency mixers 14-1 and 14-2. The oscillation output voltage V(t) of the VCO 10 is supplied to the high frequency mixer 14-1 as a voltage V1(t) and also to a delay unit 12 and π/2 phase shifter 24. The delay unit 12 delays the oscillation output voltage V(t) of the VCO 10 by a delay time τ, the delayed oscillation output voltage being then supplied to the high frequency mixers 14-1 and 14-2 as a voltage V2(t). The π/2 phase shifter 24 phase-shifts the oscillation output voltage V(t) of the VCO 10 by π/2 radian, the phase-shifted oscillation output voltage being then supplied to the high frequency mixer 14-2 as a voltage V3(t). The high frequency mixer 14-1 multiplies the voltages V1(t) and V2(t) by each other to form an output voltage VP1(t). The high frequency mixer 14-2 multiplies the voltages V2(t) and V3(t) by each other to form an output voltage VP2(t).

If the oscillation output voltage V(t) of the VCO 10 is represented by the aforementioned formula, the voltages V1(t)–V3(t) supplied to the high frequency mixers 14-1 and 14-2 can be respectively represented by:

$$V1(t) = A \cdot \cos(\omega t + \phi(t));$$

$$V2(t) = A \cdot \cos(\omega(t-\tau) + \phi(t-\tau)); \text{ and}$$

$$V3(t) = A \cdot \cos(\omega t + \phi(t) - \pi/2).$$

Therefore, the output voltage VP1(t) of the high frequency mixer 14-1 can be represented by:

$$\begin{aligned}
VP1(t) &= A \cdot \cos(\omega t + \phi(t)) \\
&\quad \times A \cdot \cos(\omega(t-\tau) + \phi(t-\tau)) \\
&= 1/2 \cdot A^2 \cdot \cos(2\omega t - \omega\tau + \phi(t) + \phi(t-\tau)) \\
&\quad + 1/2 \cdot A^2 \cdot \cos(\omega\tau + \phi(t) - \phi(t-\tau)) \\
&= 1/2 \cdot A^2 \cdot \cos(2\omega t - \omega\tau + \phi(t) + \phi(t-\tau)) \\
&\quad + 1/2 \cdot A^2 \cdot \cos\omega\tau \cos(\phi(t) - \phi(t-\tau)) \\
&\quad - 1/2 A^2 \sin\omega\tau \sin(\phi(t) - \phi(t-\tau)).
\end{aligned}$$

Since $\phi(t) - \phi(t-\tau)$ is very small in the above formula, $\cos(\phi(t) - \phi(t-\tau)) \approx 1$; and $\sin(\phi(t=\tau)) \approx \phi(t) - \phi(t-\tau)$ are approximately established. Thus, the above formula VP1(t) can be transformed into:

$$\begin{aligned}
VP1(t) &= 1/2 \cdot A^2 \cdot \cos(2\omega t - \omega\tau + \phi(t) + \phi(t-\tau)) \\
&\quad + 1/2 \cdot A^2 \cdot \cos\omega\tau \\
&\quad - 1/2 \cdot A^2 \cdot \sin\omega\tau \cdot (\phi(t) - \phi(t-\tau)).
\end{aligned}$$

Similarly, the output voltage VP2(t) of the high frequency mixer 14-2 can be represented by:

$$\begin{aligned}
VP2(t) &= A \cdot \cos(\omega t + \phi(t) - \pi/2) \\
&\quad \times A \cdot \cos(\omega(t-\tau) + \phi(t-\tau)) \\
&= 1/2 \cdot A^2 \cdot \cos(2\omega t - \omega\tau + \phi(t) + \phi(t-\tau) - \pi/2) \\
&\quad + 1/2 \cdot A^2 \cdot \cos(\omega\tau + \phi(t) - \phi(t-\tau) - \pi/2) \\
&= 1/2 \cdot A^2 \cdot \cos(2\omega t - \omega\tau + \phi(t) + \phi(t-\tau) - \pi/2) \\
&\quad + 1/2 \cdot A^2 \cdot \cos(\omega\tau - \pi/2) \cdot \cos(\phi(t) - \phi(t-\tau)) \\
&\quad - 1/2 \cdot A^2 \cdot \sin(\omega\tau - \pi/2) \cdot \sin(\phi(t) - \phi(t-\tau)) \\
&\approx 1/2 \cdot A^2 \cdot \sin(2\omega t - \omega\tau + \phi(t) + \phi(t-\tau)) \\
&\quad + 1/2 \cdot A^2 \cdot \sin\omega\tau \cdot \cos(\phi(t) - \phi(t-\tau)) \\
&\quad + 1/2 \cdot A^2 \cdot \cos\omega\tau \cdot \sin(\phi(t) - \phi(t-\tau)) \\
&= 1/2 \cdot A^2 \cdot \sin(2\omega t - \omega\tau + \phi(t) + \phi(t-\tau)) \\
&\quad + 1/2 \cdot A^2 \cdot \sin\omega\tau \\
&\quad + 1/2 \cdot A^2 \cdot \cos\omega\tau \cdot (\phi(t) - \phi(t-\tau)).
\end{aligned}$$

The back stages of the high frequency mixers 14-1 and 14-2 include LPF's 16-1 and 16-2, respectively. Each of the LPF's 16-1 and 16-2 functions to remove high frequency components from the output voltage VP1(t) or VP2(t) of the high frequency mixer 14-1 or 14-2. Therefore, the output voltages VLF1 and VLF2 of the LPF's 16-1 and 16-2 can be represented respectively by:

$$VLF1 = \tfrac{1}{2} \cdot A^2 \cdot \cos\omega\tau - \tfrac{1}{2} A^2 \sin\omega\tau \, (\phi(t) - \phi(t-\tau)); \text{ and}$$

$$VLF2 = \tfrac{1}{2} \cdot A^2 \cdot \sin\omega\tau + \tfrac{1}{2} \cdot A^2 \cdot \cos\omega\tau \cdot (\phi(t) - \phi(t-\tau)).$$

The back stage of each of the LPF's 16-1 and 16-2 includes a high-pass filter (HPF) 26-1 or 26-2 and a low frequency mixer 28-1 or 28-2. HPF 26-1 functions to remove DC components from the output voltage VLF1 of the LPF 16-1 while HPF 26-2 functions to remove DC components from the output voltage VLF2 of the LPF 16-2. Thus, the voltages VHF1 and VHF2 obtained by the HPF's 26-1 and 26-2 can be represented by:

$$VHF1 = -\tfrac{1}{2} \cdot A^2 \cdot \sin\omega\tau \cdot (\phi(t) - \phi(t-\tau)); \text{ and}$$

$$VLF2 = \tfrac{1}{2} \cdot A^2 \cdot \cos\omega\tau \cdot (\phi(t) - \phi(t-\tau)).$$

The low frequency mixer 28-1 multiplies the voltages VLF1 and VHF2 by each other to form a voltage VM01 which is in turn supplied to a subtracter 30. The low frequency mixer 28-2 multiplies the voltages VLF2 and VHF1 by each other to form a voltage VM02 which is in turn supplied to the subtracter 30. The voltage VM01 can be represented by:

$$VM01 = \tfrac{1}{4} \cdot A^4 \cdot \cos^2\omega\tau \cdot (\phi(t) - \phi(t-\tau)) - \tfrac{1}{4} \cdot A^4 \cdot \sin\omega\tau \cdot \cos\omega\tau \cdot (\phi(t) - \phi(t-\tau))^2.$$

The voltage VM02 can be represented by:

$$VM02 = -\tfrac{1}{4} \cdot A^4 \cdot \sin^2\omega\tau \cdot (\phi(t) - \phi(t-\tau)) - \tfrac{1}{4} \cdot A^4 \cdot \sin\omega\tau \cdot \cos\omega\tau \cdot (\phi(t) - \phi(t-\tau))^2.$$

The first right term of each of the formulas representing the voltages VM01 and VM02 shows primary components relative to the phase noise components $\phi(t) - \phi(t-\tau)$ (primary phase noise components) while the second right term thereof shows secondary components (secondary phase noise components). The primary phase noise components contained in the voltages VM01 and VM02 depend on the delay time $\tau$ of the delay unit 12. Since the front stage of the high frequency mixer 14-2 includes the $\pi/2$ phase shifter 24, the primary phase noise components of the voltage VM01 are proportional to $\cos^2\omega\tau$ while the primary phase noise components of the voltage VM02 are proportional to $\sin^2\omega\tau$.

Therefore, the subtracter 30 which subtracts the voltage VM02 from the voltage VM01 can counteract not only the secondary phase noise components but also the dependency on the delay time $\tau$. In other words, the subtracter 30 can provide a voltage Vout:

$$\begin{aligned}
Vout &= 1/4 \cdot A^4 \cdot \sin^2\omega\tau \cdot (\phi(t) - \phi(t-\tau)) \\
&\quad + 1/4 \cdot A^4 \cdot \cos^2\omega\tau \cdot (\phi(t) - \phi(t-\tau)) \\
&= 1/4 \cdot A^4 \cdot (\phi(t) - \phi(t-\tau)).
\end{aligned}$$

When such a voltage Vout is supplied to the VCO 10 as a control voltage, a low-noise oscillation circuit suitable for use in a synthesizer or the like can be realized without use of any voltage controlled delay unit.

Figure 2:
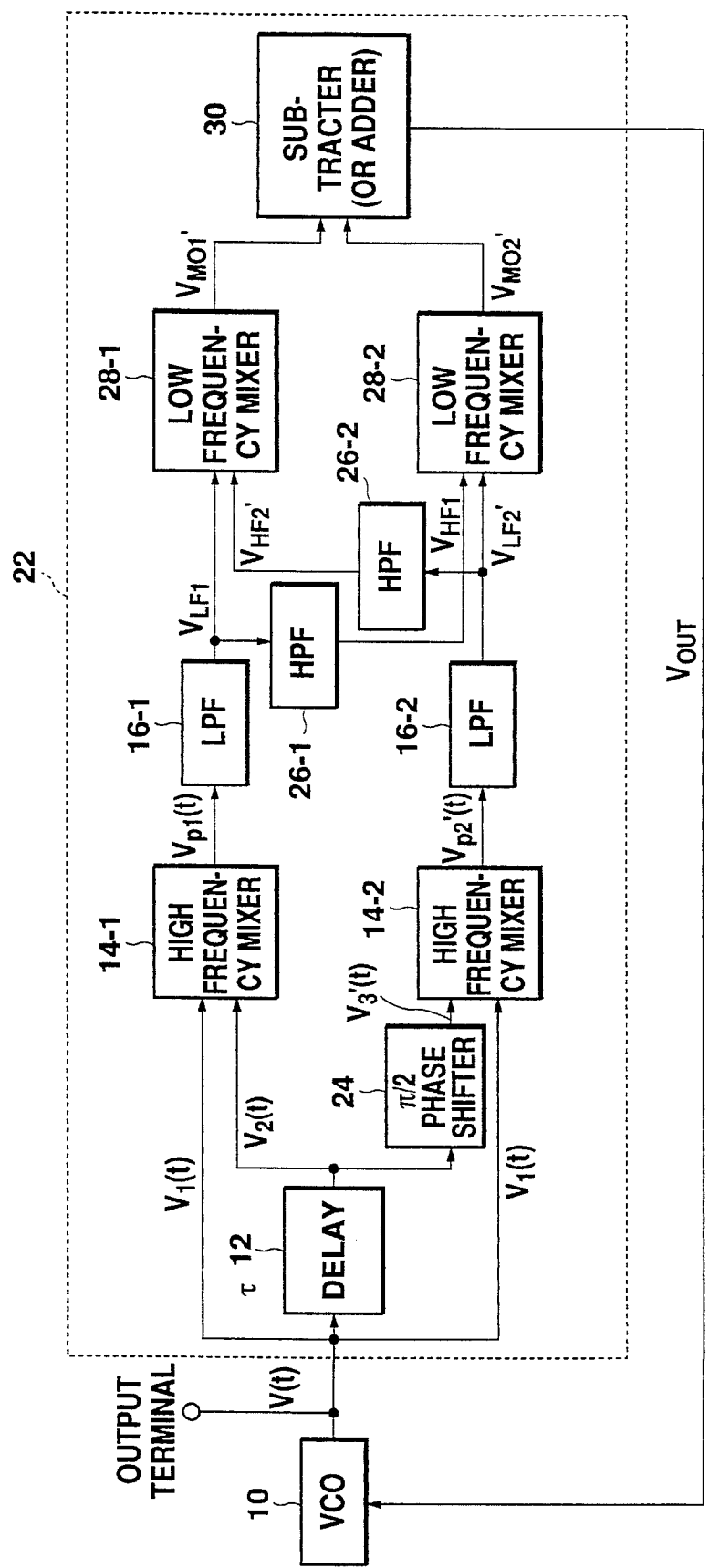
FIG. 2 is a block diagram of a second embodiment of a low-noise oscillation circuit constructed in accordance with the present invention.

The high frequency mixers 14-1 and 14-2 of this embodiment may be realized, for example, by double balanced mixers as in the prior art. The $\pi/2$ phase shifter 24 functions to produce a phase orthogonality between the output voltages VP1(t) and VP2(t) of the high frequency mixers 14-1 and 14-2. Therefore, the $\pi/2$ phase shifter 24 may be located between the delay unit 12 and the high frequency mixer 14-2 as shown in FIG. 2, with the same advantages as in the circuit of FIG. 1.

Figure 3:
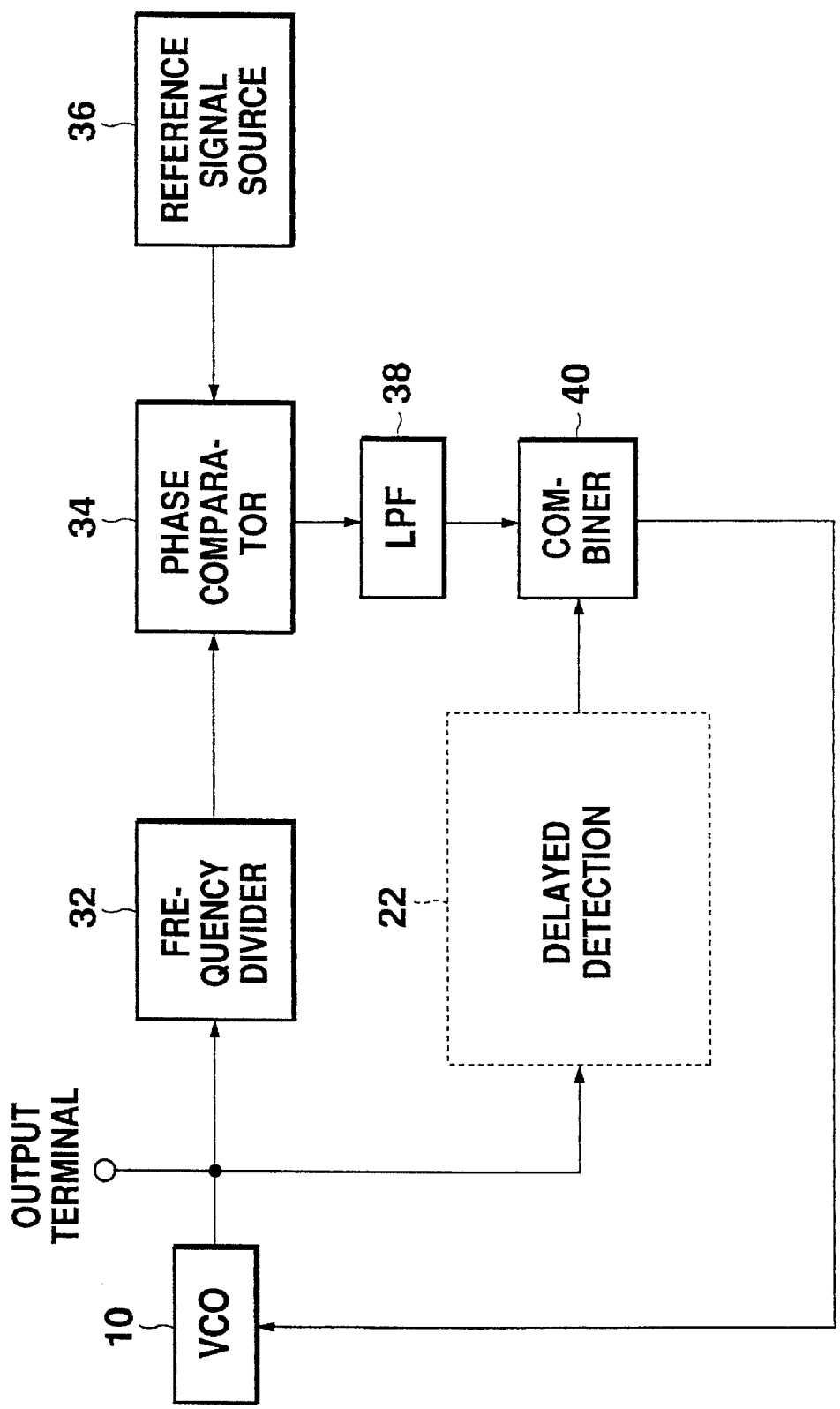
FIG. 3 is a block diagram of the use of the respective embodiments according to the present invention.

FIG. 3 shows an application of the aforementioned circuit according to the present invention. In such an application, the oscillation output of the VCO 10 is divided by a frequency divider 32 and then supplied to a phase comparator 34. The phase comparator 34 also receives a reference signal from a reference signal source 36. The phase comparator 34 compares the output of the frequency divider 32 with the output of the reference signal source 36, the result being then supplied to a combiner 40 through an LPF 38 for stabilizing the loop. The combiner 40 combines the output of the delay detection circuit 22 (i.e., control voltage Vout) with the output of the LPF 38, the combined voltage being then supplied to the VCO 10. In such an arrangement, the frequency locked loop using the present invention can be coupled to the phase locked loop of the prior art. Although the subtracter 30 has been described in connection with the previous embodiment, it may be replaced by an adder when the low frequency mixers 28-1 and 28-2 have a function of reversing their output polarity.

As described, the present invention can accomplish low-noise oscillation by using two high frequency mixers, using a phase shifter for phase-shifting the output of the VCO or delay unit by $\pi/2$ radian to provide an orthogonality between the output of the first and second high frequency mixers, utilizing such an orthogonality to provide primary phase noise components without dependence of the delay time and using the primary phase noise components as control voltage for the VCO. Therefore, it is not required to feed back the outputs of the high frequency mixers to control the delay time in the delay unit. This enables any LPF and DC amplifier for forming the feedback loop to be eliminated. On the other hand, the present invention does not require such a device as a varactor or the like which would be required to form a voltage controlled delay unit. Therefore, the low-noise oscillation circuit can be more integrated and miniaturized.

We claim:

1. A delay detection circuit for detecting, with delay processing, the oscillation output of a voltage controlled oscillator which oscillates at a frequency corresponding to a control voltage, comprising:

a first high frequency mixer for multiplying said oscillation output by a delayed oscillation output obtained by delaying the oscillation output by a predetermined delay time to generate a first high frequency signal;

a second high frequency mixer for multiplying said delayed oscillation output by a phase-shifted oscillation output obtained by phase-shifting said oscillation output or delayed oscillation output by $\pi/2$ radian to generate a second high frequency signal;

a first low frequency mixer for multiplying the DC and phase-noise components contained in the first high frequency signal by the phase-noise components contained in the second high frequency signal to generate a first low frequency signal;

a second low frequency mixer for multiplying the DC and phase-noise components contained in the second high frequency signal by the phase-noise components contained in the first high frequency signal to generate a second low frequency signal; and adder-subtracter means responsive to the second low frequency signal for removing dependence on the predetermined delay time from primary phase-noise components contained in the first low frequency signal to generate said control voltage without said dependence.

2. A delay detection circuit as defined in claim 1, further comprising:

a delay unit for delaying said oscillation output by the predetermined delay time to generate the delayed oscillation output; and a phase shifter for phase-shifting said oscillation output by $\pi/2$ radian to generate the phase-shifted oscillation output.

3. A delay detection circuit as defined in claim 1, further comprising:

a delay unit for delaying said oscillation output by the predetermined delay time to generate the delayed oscillation output; and a phase shifter for phase-shifting said delayed oscillation output by $\pi/2$ radian to generate the phase-shifted oscillation output.

4. A delay detection circuit as defined in claim 1 wherein said adder-subtracter means is responsive to the second low frequency signal for removing secondary phase noise components from the first low frequency signal.

5. A delay detection circuit as defined in claim 1, further comprising a first low-pass filter for removing components corresponding to harmonic components of said oscillation output from the first high frequency signal prior to the multiplication of the first and second low frequency mixers.

6. A delay detection circuit as defined in claim 5, further comprising a first high-pass filter for removing DC components from the first high frequency signal passed through the first low-pass filter prior to the multiplication of the second low frequency mixer.

7. A delay detection circuit as defined in claim 1, further comprising a second low-pass filter for removing components corresponding to harmonic components of said oscillation output from the second high frequency signal prior to the multiplication of the first and second low frequency mixers.

8. A delay detection circuit as defined in claim 7, further comprising a second high-pass filter for removing DC components from the second high frequency signal passed through the second low-pass filter prior to the multiplication of the first low frequency mixer.

9. A delay detection circuit as defined in claim 5, further comprising a second low-pass filter for removing components corresponding to harmonic components of said oscillation output from the second high frequency signal prior to the multiplication of the first and second low frequency mixers.

10. A delay detection circuit as defined in claim 9, further comprising a second high-pass filter for removing DC components from the second high frequency signal passed through the second low-pass filter prior to the multiplication of the first low frequency mixer.

11. A low-noise oscillation circuit comprising:

a voltage controlled oscillator oscillating with a frequency corresponding to a control voltage; and a delay detection circuit for detecting, with delay processing, the oscillation output of said voltage controlled oscillator, said delayed detection circuit comprising:

a) a first high frequency mixer for multiplying said oscillation output by a delayed oscillation output obtained by delaying the oscillation output by a predetermined delay time to generate a first high frequency signal;

b) a second high frequency mixer for multiplying said delayed oscillation output by a phase-shifted oscillation output obtained by phase-shifting said oscillation output or delayed oscillation output by $\pi/2$ radian to generate a second high frequency signal;

c) a first low frequency mixer for multiplying the DC and phase-noise components contained in the first high frequency signal by the phase-noise components contained in the second high frequency signal to generate a first low frequency signal;

d) a second low frequency mixer for multiplying the DC and phase-noise components contained in the second high frequency signal by the phase-noise components contained in the first high frequency signal to generate a second low frequency signal; and e) adder-subtracter means responsive to the second low frequency signal for removing dependence on the predetermined delay time from primary phase-noise components contained in the first low frequency signal to generate said control voltage without said dependence.

12. A low-noise oscillation circuit comprising:

a voltage controlled oscillator oscillating with a frequency corresponding to a control voltage;

a frequency locked loop for locking the oscillation frequency of said voltage controlled oscillator at a target value; and a phase locked loop for locking the oscillation phase of said voltage controlled oscillator at a target value, said frequency locked loop comprising:

a) a first high frequency mixer for multiplying said oscillation output by a delayed oscillation output obtained by delaying the oscillation output by a predetermined delay time to generate a first high frequency signal;

b) a second high frequency mixer for multiplying said delayed oscillation output by a phase-shifted oscillation output obtained by phase-shifting said oscillation output or delayed oscillation output by $\pi/2$ radian to generate a second high frequency signal;

c) a first low frequency mixer for multiplying the DC and phase-noise components contained in the first high frequency signal by the phase-noise components contained in the second high frequency signal to generate a first low frequency signal;

d) a second low frequency mixer for multiplying the DC and phase-noise components contained in the second high frequency signal by the phase-noise components contained in the first high frequency signal to generate a second low frequency signal; and e) adder-subtracter means responsive to the second low frequency signal for removing dependence on the predetermined delay time from primary phase-noise components contained in the first low frequency signal to generate said control voltage without said dependence.

* * * * *